(12) United States Patent
Obu et al.

(10) Patent No.: US 10,134,842 B2
(45) Date of Patent: Nov. 20, 2018

(54) HETEROJUNCTION BIPOLAR TRANSISTOR

(71) Applicant: MURATA MANUFACTURING CO., LTD., Kyoto-fu (JP)

(72) Inventors: Isao Obu, Nagaokakyo (JP); Shigeru Yoshida, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 15/588,859

(22) Filed: May 8, 2017

(65) Prior Publication Data

US 2017/0243939 A1 Aug. 24, 2017

Related U.S. Application Data

(63) Continuation of application No. PCT/JP2015/079022, filed on Oct. 14, 2015.

(30) Foreign Application Priority Data

Feb. 17, 2015 (JP) .................................. 2015-028974

(51) Int. Cl.
*H01L 29/737* (2006.01)
*H01L 29/10* (2006.01)
*H01L 29/66* (2006.01)
*H01L 27/102* (2006.01)
*H01L 29/732* (2006.01)
(Continued)

(52) U.S. Cl.
CPC ...... *H01L 29/1004* (2013.01); *H01L 27/0823* (2013.01); *H01L 27/1022* (2013.01); *H01L 29/0692* (2013.01); *H01L 29/0817* (2013.01); *H01L 29/205* (2013.01); *H01L 29/41708* (2013.01); *H01L 29/66234* (2013.01); *H01L 29/732* (2013.01); *H01L 29/7304* (2013.01); *H01L 29/7371* (2013.01); *H03F 1/56* (2013.01); *H03F 3/21* (2013.01); *H03F 2200/222* (2013.01); *H03F 2200/318* (2013.01); *H03F 2200/387* (2013.01); *H03F 2200/411* (2013.01)

(58) Field of Classification Search
CPC ............... H01L 27/102; H01L 27/1022; H01L 27/1024; H01L 29/70
See application file for complete search history.

(56) References Cited

U.S. PATENT DOCUMENTS

| 6,768,140 B1 | 7/2004 | Hong et al. |
| 2004/0195588 A1 | 10/2004 | Hase |
| 2005/0156194 A1 | 7/2005 | Ohbu et al. |

FOREIGN PATENT DOCUMENTS

| CN | 1659712 A | 8/2005 |
| JP | H09-008405 A | 1/1997 |

(Continued)

OTHER PUBLICATIONS

International Search Report issued in PCT/JP2015/079022; dated Jan. 19, 2016.

(Continued)

*Primary Examiner* — Cheung Lee
(74) *Attorney, Agent, or Firm* — Studebaker & Brackett PC

(57) ABSTRACT

A high-performance HBT that is unlikely to decrease the process controllability and to increase the manufacturing cost is implemented. A heterojunction bipolar transistor includes an emitter layer, a base layer, and a collector layer on a GaAs substrate. The emitter layer is formed of InGaP. The base layer is formed of GaAsPBi having a composition that substantially lattice-matches GaAs.

12 Claims, 14 Drawing Sheets

(51) Int. Cl.
  *H01L 27/082*   (2006.01)
  *H01L 29/205*   (2006.01)
  *H01L 29/73*    (2006.01)
  *H03F 1/56*     (2006.01)
  *H03F 3/21*     (2006.01)
  *H01L 29/417*   (2006.01)
  *H01L 29/06*    (2006.01)
  *H01L 29/08*    (2006.01)

(56) References Cited

FOREIGN PATENT DOCUMENTS

| | | |
|---|---|---|
| JP | 2001-044212 A | 2/2001 |
| JP | 2004-071669 A | 3/2004 |
| JP | 2005-236259 A | 9/2005 |
| JP | 2007-145643 A | 6/2007 |
| TW | 200411927 A | 7/2004 |

OTHER PUBLICATIONS

Written Opinion issued in PCT/JP2015/079022; dated Jan. 19, 2016.

An Office Action; "Notice of Reasons for Rejection," issued by the Japanese Patent Office on Aug. 16, 2017, which corresponds to Japanese Patent Application No. 2017-500277 and is related to U.S. Appl. No. 15/588,859; with English language translation.

TW Office Action dated Mar. 22, 2017, from corresponding TW Appl No. 105104449, with English translation, 17 pp.

C1: $Ec\_Ga_{0.52}In_{0.48}P$
C2: $Ec\_GaAs$
C3: $Ec\_GaAs_{(1-Y-Z)}P_{(Y)}Bi_{(Z)}$
V1: $Ev\_Ga_{0.52}In_{0.48}P$
V2: $Ec\_GaAs$
V3: $Ec\_GaAs_{(1-Y-Z)}P_{(Y)}Bi_{(Z)}$

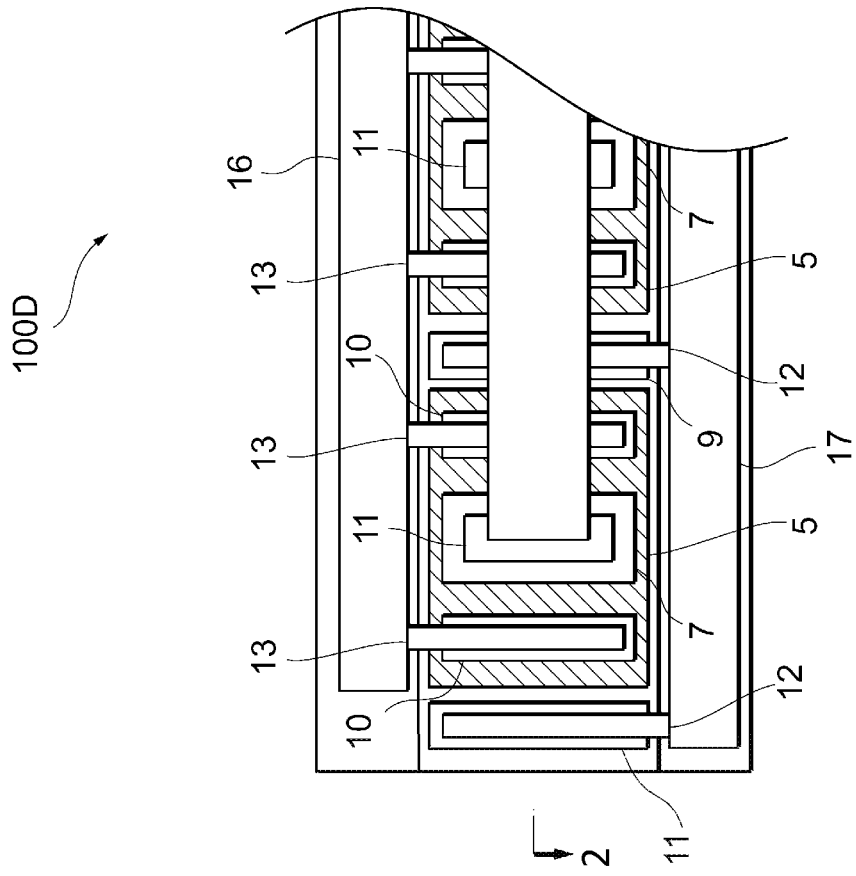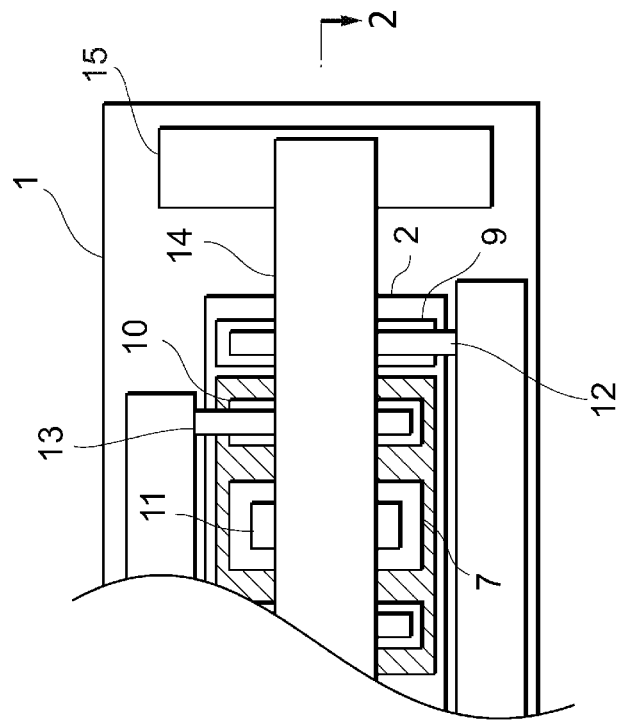
FIG. 9

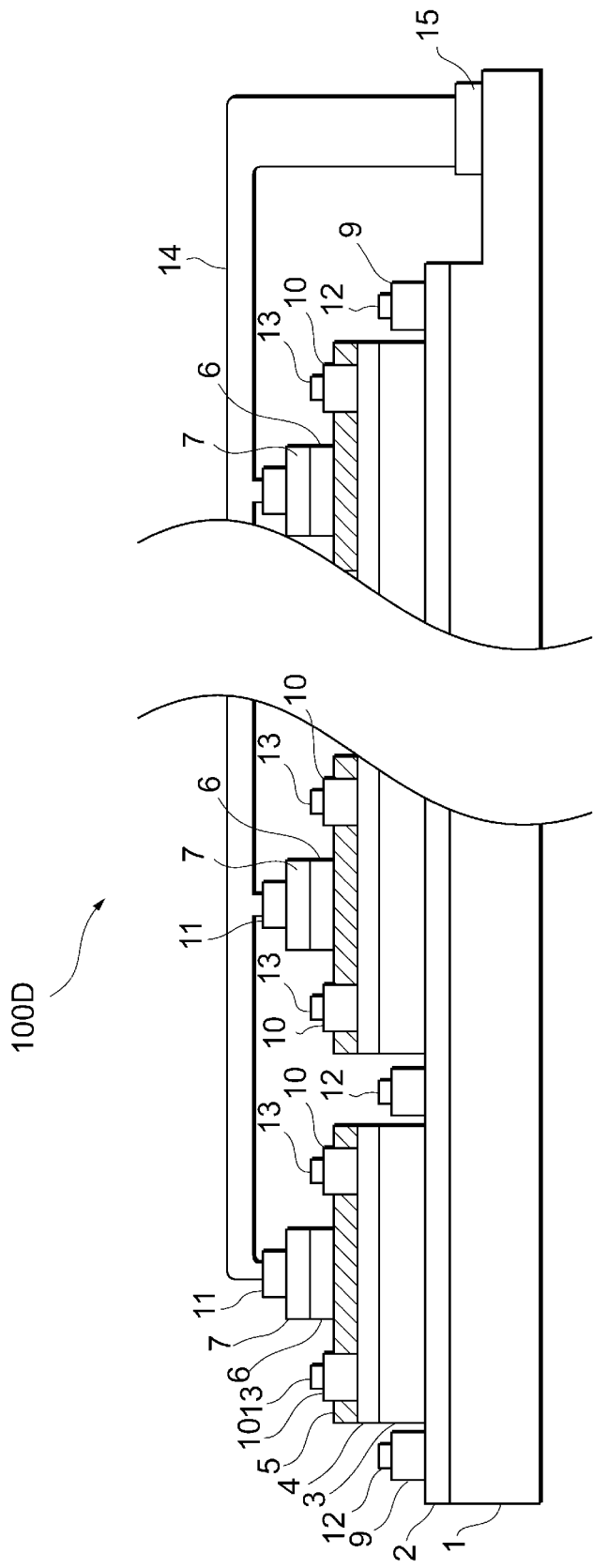

HETEROJUNCTION BIPOLAR TRANSISTOR

CROSS REFERENCE TO RELATED APPLICATIONS

This application claims benefit of priority to Japanese Patent Application 2015-028974 filed Feb. 17, 2015, and to International Patent Application No. PCT/JP2015/079022 filed Oct. 14, 2015, the entire content of which is incorporated herein by reference.

TECHNICAL FIELD

The present disclosure relates to a heterojunction bipolar transistor.

BACKGROUND

As one of major components of a mobile communication terminal, such as a cellular phone, is a power amplifier. As a semiconductor device for a power amplifier, a heterojunction bipolar transistor (HBT), which exhibits high efficiency, high linearity, and high current drive capability, is typically used.

Mobile communication terminals are used mainly for consumers, and a reduction in the cost of HBTs is highly demanded. That is, it is desirable to manufacture HBTs by using an inexpensive GaAs substrate instead of an expensive substrate, such as an InP substrate. Thus, developing of high-performance HBTs using a GaAs substrate is highly demanded.

For example, Japanese Unexamined Patent Application Publication No. 2004-71669 discloses a technology for enhancing the performance of HBTs, and more specifically, a technology for reducing the base resistance and the offset voltage (voltage $V_{CE}$ at which the collector current $I_C$ starts to flow).

SUMMARY

Technical Problem

To reduce the base resistance, it is important to lower a Schottky barrier to the base layer by raising the energy level in the valence band edge $E_V$ of the base layer. To reduce the offset voltage, it is important to decrease the energy discontinuity (conduction-band offset) $\Delta E_C$ in the conduction band edge $E_C$ that occurs between the emitter layer and the base layer.

For example, Japanese Unexamined Patent Application Publication No. 2004-71669 discloses a configuration in which GaAsBi is used for the base layer so as to reduce the base resistance. GaAsBi makes it possible to raise the energy level in the valence band edge $E_V$ to be higher than GaAs so that the Schottky barrier to the base layer can be lowered and the hole mobility can be increased. As a result, the base resistance is reduced.

Japanese Unexamined Patent Application Publication No. 2004-71669 also discloses a configuration in which GaAsBiN is used for the base layer and GaAs is used for the emitter layer so as to reduce both of the base resistance and the offset voltage. GaAs makes it possible to lower the energy level in the conduction band edge $E_C$ to be lower than InGaP so that the energy discontinuity $\Delta E_C$ in the conduction band edge between the GaAs emitter layer and the GaAsBiN base layer can be decreased. The energy barrier to electrons is thus lowered, and the offset voltage is accordingly reduced. It is thus possible to reduce both of the base resistance and the offset voltage. On the other hand, however, it is necessary to change the materials for both of the emitter layer and the base layer, and also, it is not possible to employ selective etching for emitter mesa etching, thereby decreasing the process controllability.

Japanese Unexamined Patent Application Publication No. 2004-71669 also discloses a configuration in which the emitter layer is formed as a three-layered structure of an n-GaAs first emitter layer, an n-InGaP etch stop layer, and an n-GaAs second emitter layer. This configuration, however, makes epitaxial growth complicated, which increases the manufacturing cost of HBTs.

The present disclosure has been made in view of the above-described background. It is an object of the present disclosure to implement a high-performance HBT that is unlikely to decrease the process controllability and to increase the manufacturing cost.

Solution to Problem

In order to solve the above-described problem, a heterojunction bipolar transistor according to one aspect of the present disclosure includes an emitter layer, a base layer, and a collector layer on a GaAs substrate. The emitter layer is formed of InGaP, and the base layer is formed of GaAsPBi having a composition that substantially lattice-matches GaAs.

Advantageous Effects of Disclosure

According to the present disclosure, it is possible to implement a high-performance HBT that is unlikely to decrease the process controllability and to increase the manufacturing cost.

BRIEF DESCRIPTION OF THE DRAWINGS

FIG. 9 is a plan view of a HBT 100D according to another embodiment of the present disclosure.

FIG. 10 is a sectional view of the HBT 100D taken along line 2-2 in FIG. 9.

DETAILED DESCRIPTION

Figure 1:
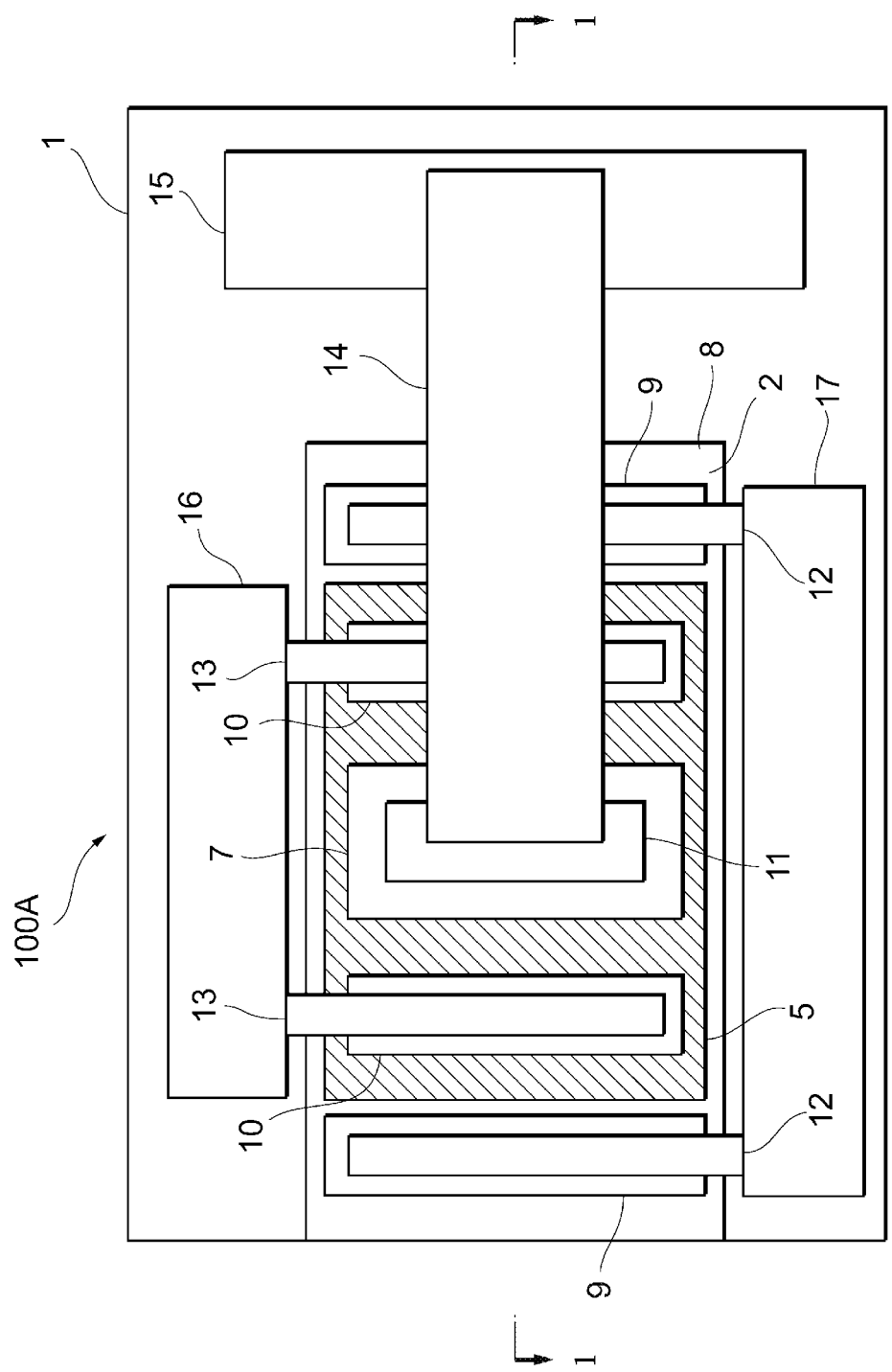
FIG. 1 is a plan view of a HBT 100A according to an embodiment of the present disclosure.
Figure 2:
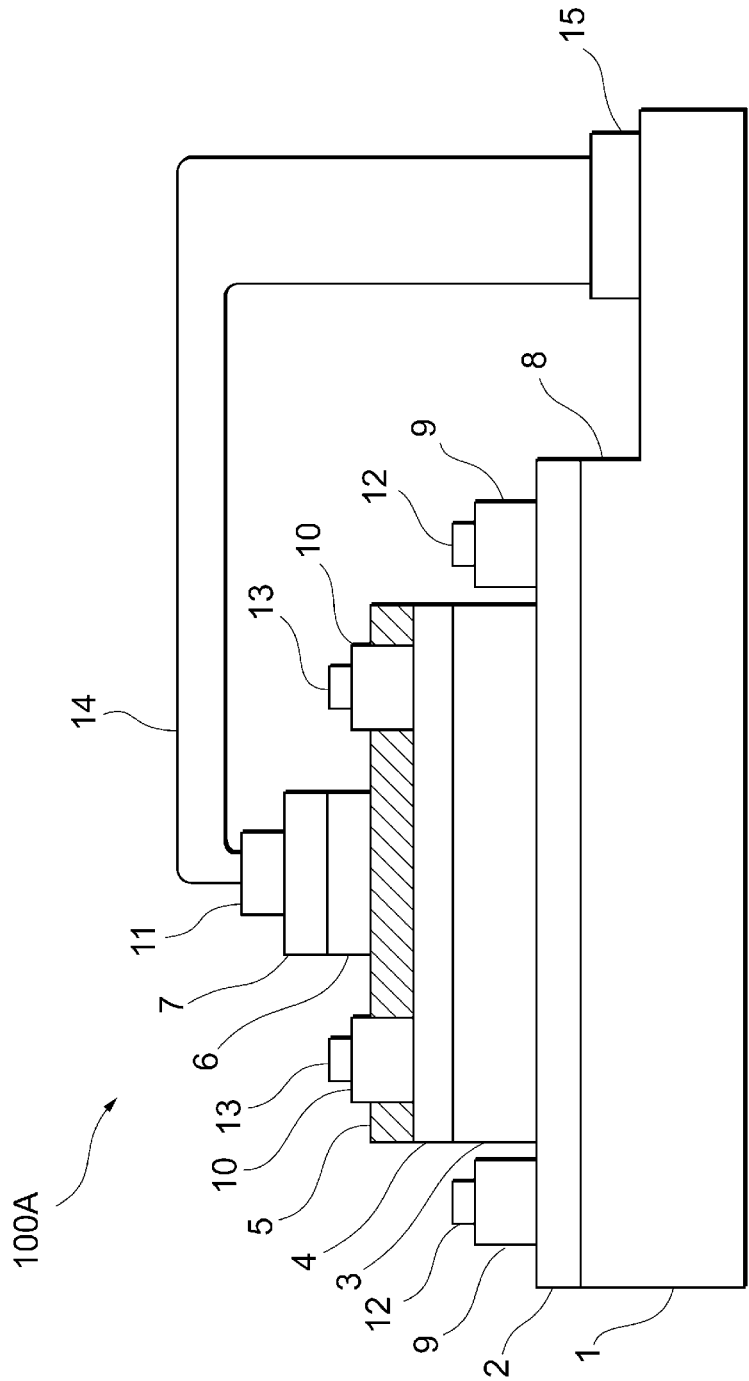
FIG. 2 is a sectional view of the HBT 100A taken along line 1-1 in FIG. 1.

An embodiment of the present disclosure will be described below with reference to the drawings. FIG. 1 is a plan view of a HBT 100A according to an embodiment of the present disclosure. FIG. 2 is a sectional view of the HBT 100A taken along line 1-1 in FIG. 1. As shown in FIGS. 1 and 2, in the HBT 100A, on a GaAs substrate 1, a sub-collector layer 2 (n-type GaAs) (a Si-doping concentration of $5 \times 10^{18}$ cm$^{-3}$ and a film thickness of 0.6 μm, for example), a collector layer 3 (n-type GaAs) (a Si-doping concentration of $1 \times 10^{16}$ cm$^{-3}$ and a film thickness of 1.0 μm, for example), a p-type GaAsPBi base layer 4 (a C concentration of $2 \times 10^{19}$ cm$^{-3}$ and a film thickness of 150 nm, for example), and an emitter layer 5 (n-type InGaP) (an InP mole ratio of 0.48, a Si-doping concentration of $3 \times 10^{17}$ cm$^{-3}$, and a film thickness of 30 nm, for example) are stacked on each other. Base electrodes 10 are disposed on the base layer 4 via the emitter layer 5.

On the emitter layer 5, a contact layer 6 (n-type GaAs) (a Si-doping concentration of $5 \times 10^{18}$ cm$^{-3}$ and a film thickness of 50 nm, for example) and an n-type InGaAs contact layer 7 (an InAs mole ratio of 0.5, a Si-doping concentration of $1 \times 10^{19}$ cm$^{-3}$, and a film thickness of 50 nm, for example) are provided.

An emitter electrode 11 is disposed on the contact layer 7, while collector electrodes 9 are disposed on the sub-collector layer 2. Specific examples of the collector electrodes 9, the base electrodes 10, and the emitter electrode 11 will be discussed. The collector electrodes 9 are formed by stacking AuGe (a film thickness of 60 nm, for example)/Ni (a film thickness of 10 nm, for example)/Au (a film thickness of 200 nm, for example). The base electrodes 10 are formed by stacking Ti (a film thickness of 50 nm, for example)/Pt (a film thickness of 50 nm, for example)/Au (a film thickness of 200 nm, for example). The emitter electrode 11 is made of WSi (a Si mole ratio of 0.3 and a film thickness of 0.3 μm, for example), for example.

The collector electrodes 9 are connected to a metal pad 17 shown in FIG. 1 via collector wiring patterns 12. The base electrodes 10 are connected to a metal pad 16 shown in FIG. 1 via base wiring patterns 13. The emitter electrode 11 is connected to a metal pad 15 shown in FIG. 1 via an emitter wiring pattern 14. The metal pads 15 through 17 are used for electrical connection with external devices outside the HBT 100A.

In the HBT 100A, the base layer 4 is made of GaAsPBi having a composition that substantially lattice-matches GaAs. The composition of GaAsPBi that substantially lattice-matches GaAs will be discussed below.

Figure 3:
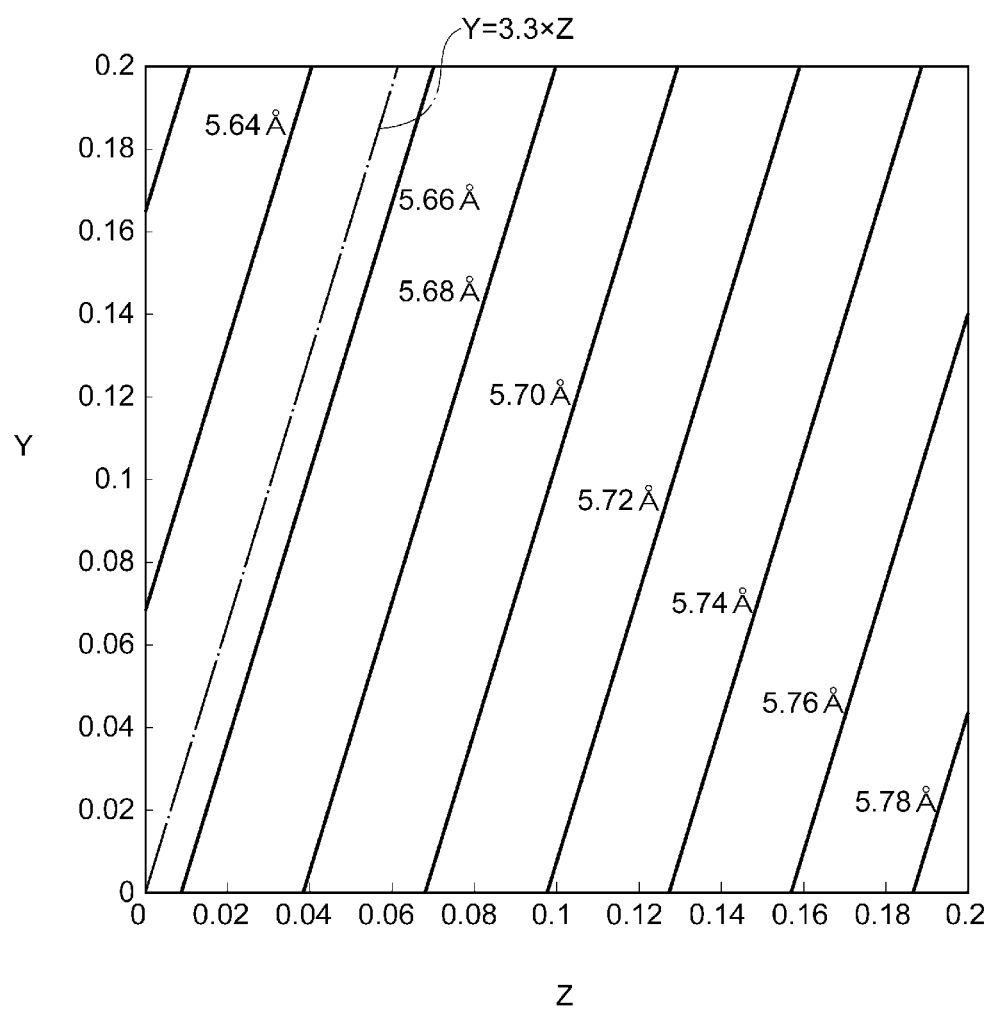
FIG. 3 is a graph illustrating the dependency of the lattice constant of $GaAs_{(1-Y-Z)}P_Y Bi_{(Z)}$ on the composition of P and that of Bi.

FIG. 3 is a graph illustrating the dependency of the lattice constant of GaAs$_{(1-Y-Z)}$P$_Y$Bi$_{(Z)}$ on the composition of P and that of Bi. In FIG. 3, the vertical axis indicates the composition Y of P, while the horizontal axis indicates the composition Z of Bi. In FIG. 3, the point at Y=Z=0 (origin at the bottom left) indicates a lattice constant of GaAs, which is 5.6533 Å. As shown in FIG. 3, when the composition of GaAs$_{(1-Y-Z)}$P$_Y$Bi$_{(Z)}$ satisfies a condition expressed by Y=3.3×Z, GaAsPBi substantially lattice-matches GaAs.

The composition of GaAsPBi forming the base layer 4 does not necessarily strictly satisfy the condition expressed by Y=3.3×Z. The difference between the lattice constant of GaAsPBi forming the base layer 4 and that of GaAs may be within 0.12%, for example. 0.12% represents a difference between the lattice constant of GaAs and that of AlGaAs, which is a material proved to substantially lattice-match GaAs.

As described above, in the HBT 100A, the base layer 4 substantially lattice-matches GaAs. The base layer 4 can thus be formed thick without causing lattice strain. As a result, the base resistance can be reduced.

Figure 4:
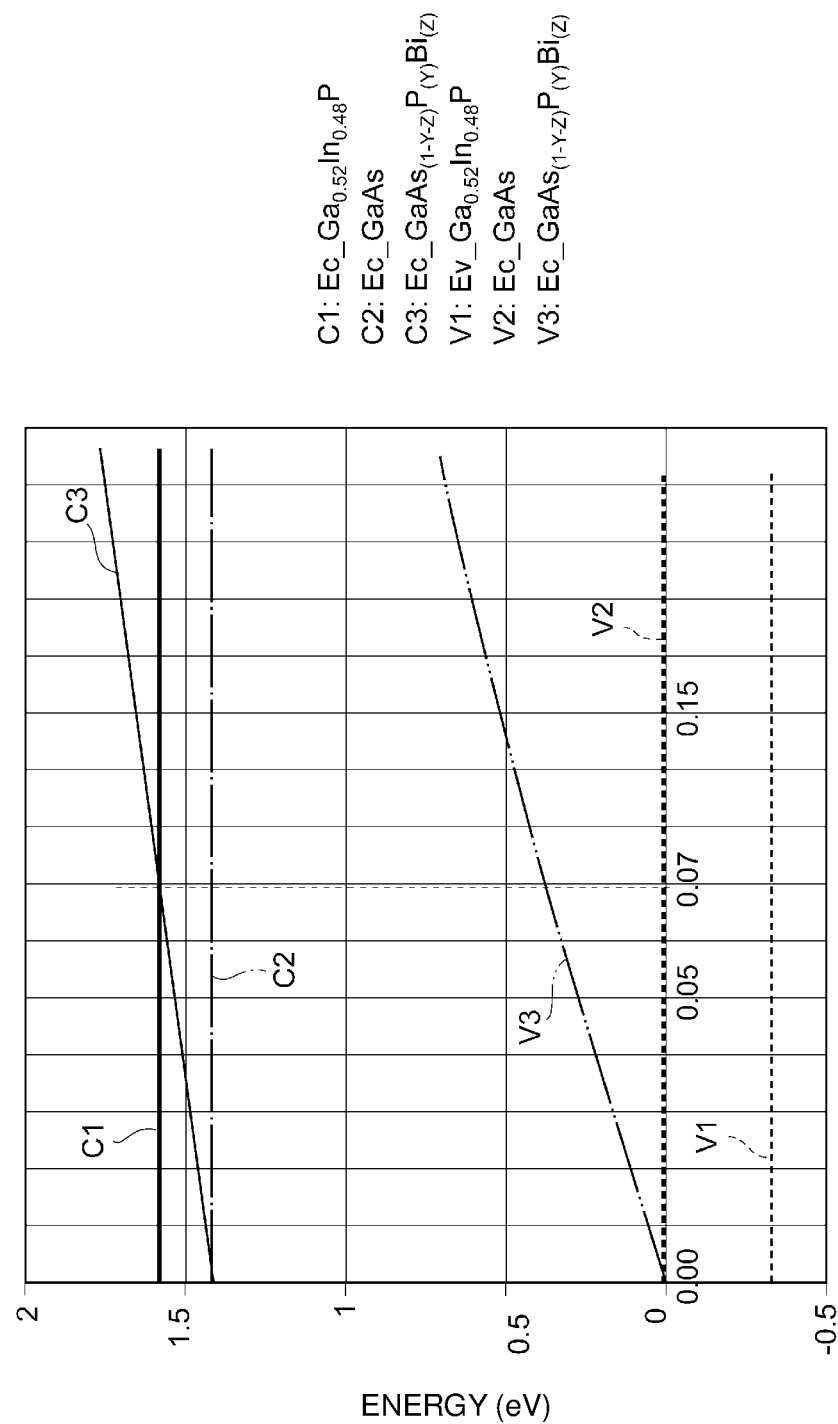
FIG. 4 is a graph illustrating energy levels in a conduction band edge $E_C$ and a valence band edge $E_V$ of a semiconductor.

In the HBT 100A, the offset voltage can also be reduced by forming the base layer 4 by GaAsPBi. The reason for this will be explained below. FIG. 4 is a graph illustrating the energy levels in the conduction band edge $E_C$ and the valence band edge $E_V$ of a semiconductor. In FIG. 4, the vertical axis indicates a relative value when energy in the valence band edge of GaAs is zero, while the horizontal axis indicates the composition Z of Bi in GaAs$_{(1-Y-Z)}$P$_Y$Bi$_{(Z)}$ that substantially lattice-matches GaAs. In FIG. 4, C1 and V1 represent energy levels in the conduction band edge and the valence band edge, respectively, of InGaP that substantially lattice-matches GaAs. C2 and V2 represent energy levels in the conduction band edge and the valence band edge, respectively, of GaAs. C3 and V3 represent energy levels in the conduction band edge and the valence band edge, respectively, of GaAsPBi that substantially lattice-matches GaAs.

As shown in FIG. 4, the energy level (C3) in the conduction band edge of GaAsPBi increases as the composition Z of Bi increases. The energy level (C3) in the conduction band edge of GaAsPBi becomes equal to the energy level (C1) in the conduction band edge of InGaP when Z≈0.07. That is, in the HBT 100A including the emitter layer 5 made of InGaP and the base layer 4 made of GaAsPBi, the energy discontinuity $\Delta E_C$ in the conduction band edge decreases as the composition Z of Bi increases, and becomes zero when Z≈0.07. This can reduce the offset voltage in the HBT 100A.

As shown in FIG. 4, the energy level (V3) in the valence band edge of GaAsPBi also increases and becomes higher than the energy level (V2) in the valence band edge of GaAs as the composition Z of Bi increases. That is, in the HBT 100A including the emitter layer 5 made of InGaP and the base layer 4 made of GaAsPBi, the Schottky barrier to the base layer is lowered to be smaller than that when the base layer is made of GaAs. This can reduce the base resistance. Additionally, the energy discontinuity $\Delta E_V$ in the valence band edge increases to be higher than that when the base layer is made of GaAs. This can improve the temperature characteristics of the current gain.

Figure 5:
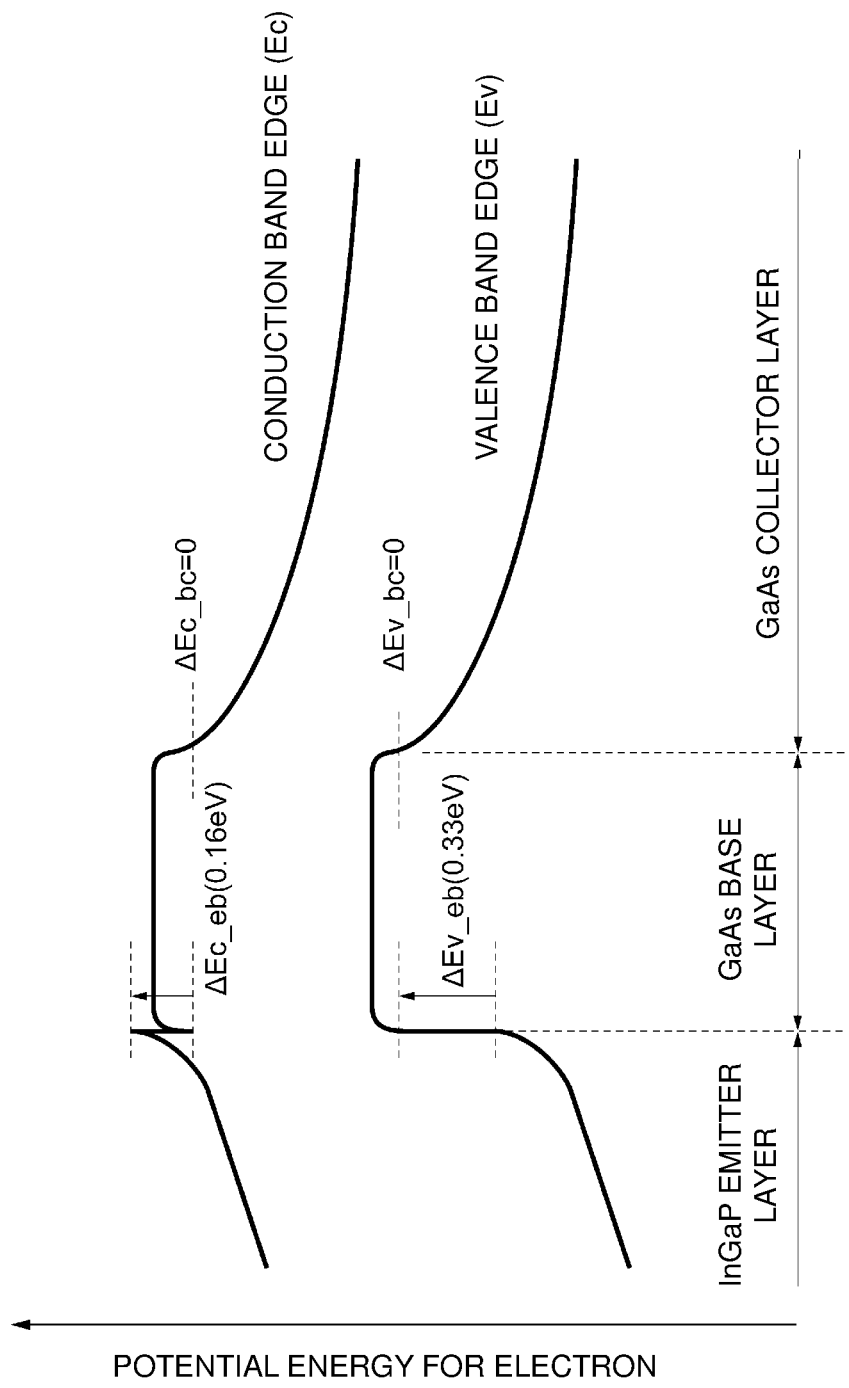
FIG. 5 is a schematic graph of energy bands in a typical HBT including an InGaP emitter layer, a GaAs base layer, and a GaAs collector layer.
Figure 6:
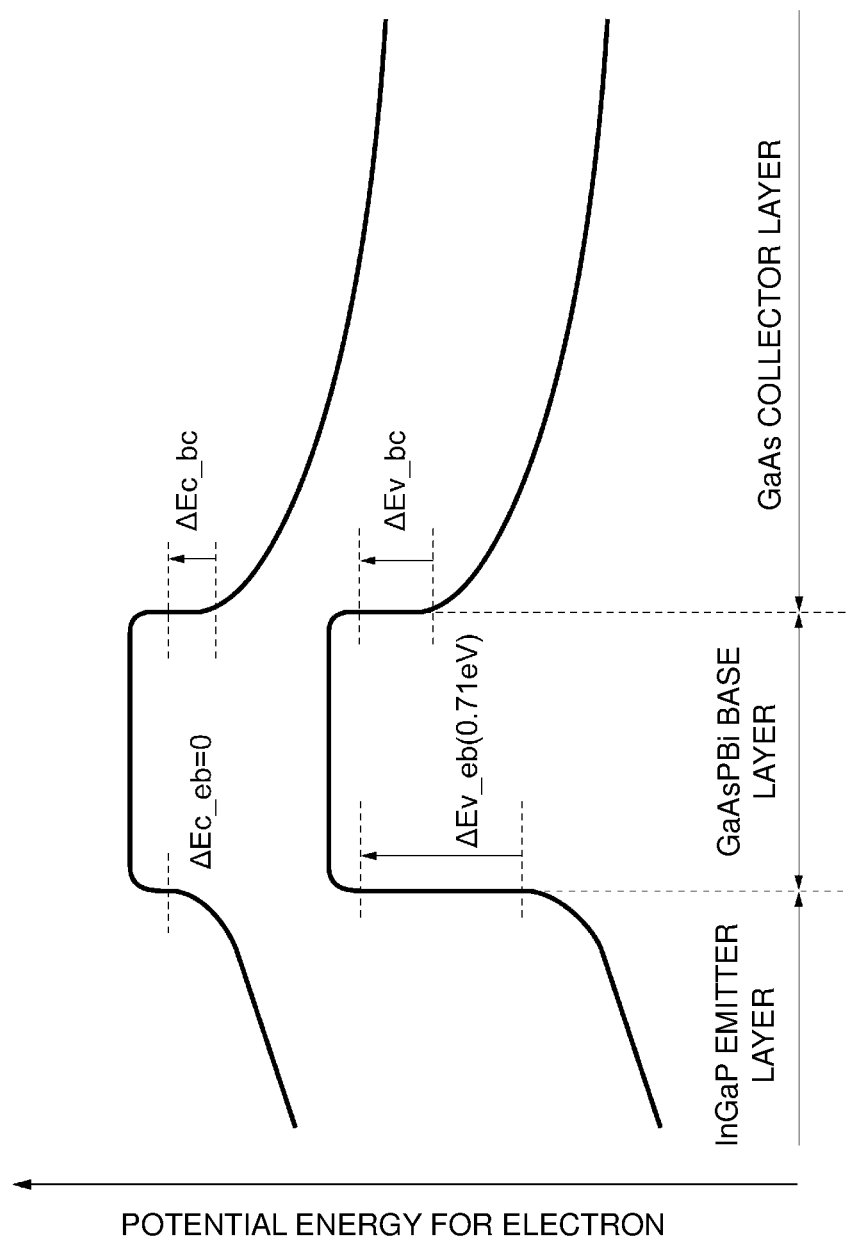
FIG. 6 is a schematic graph of energy bands in the HBT 100A including an emitter layer 5 (n-type InGaP), a GaAsPBi base layer 4, and a collector layer 3 (n-type GaAs).

The reason why the base resistance and the offset voltage can be reduced in the HBT 100A will be explained by using a schematic graph of energy bands. FIG. 5 is a schematic graph of energy bands in a typical HBT including an InGaP emitter layer, a GaAs base layer, and a GaAs collector layer. FIG. 6 is a schematic graph of energy bands in the HBT 100A including the InGaP emitter layer 5, the GaAsPBi base layer 4 having a Bi composition Z≈0.07 which substantially lattice-matches GaAs, and the GaAs collector layer 3.

As shown in FIG. 5, in the typical HBT, the energy discontinuity $\Delta E_{C\_eb}$ in the conduction band edge between the emitter layer and the base layer is about 0.16 eV, and the energy discontinuity $\Delta E_{V\_eb}$ in the valence band edge between the emitter layer and the base layer is about 0.33 eV.

As shown in FIG. 6, in the HBT 100A, the energy discontinuity $\Delta E_{C\_eb}$ in the conduction band edge between the emitter layer 5 and the base layer 4 is almost zero. It is thus possible to reduce the offset voltage in the HBT 100A to be lower than in a typical HBT. In the HBT 100A, the energy discontinuity $\Delta E_{V\_eb}$ in the valence band edge between the emitter layer 5 and the base layer 4 is about 0.71 eV. It is thus possible to reduce the base resistance in the HBT 100A to be lower than in a typical HBT. In the HBT 100A, the temperature characteristics of the current gain can also be improved. In FIG. 6, the GaAsPBi base layer having a Bi composition Z≈0.07 has been discussed by way of example. However, FIG. 5 shows that similar advantages are achieved if the Bi composition Z is 0<Z≤0.07.

In the HBT 100A, an InGaP single layer which allows selective wet etching to be employed is used as the emitter layer 5. It is thus less likely that the process controllability will be decreased and the complexity of the epitaxial multilayer film structure will be increased in the HBT 100A than in a typical HBT. By using the HBT 100A, it is possible to implement a high-performance HBT that is unlikely to decrease the process controllability and to increase the manufacturing cost.

Figure 7:
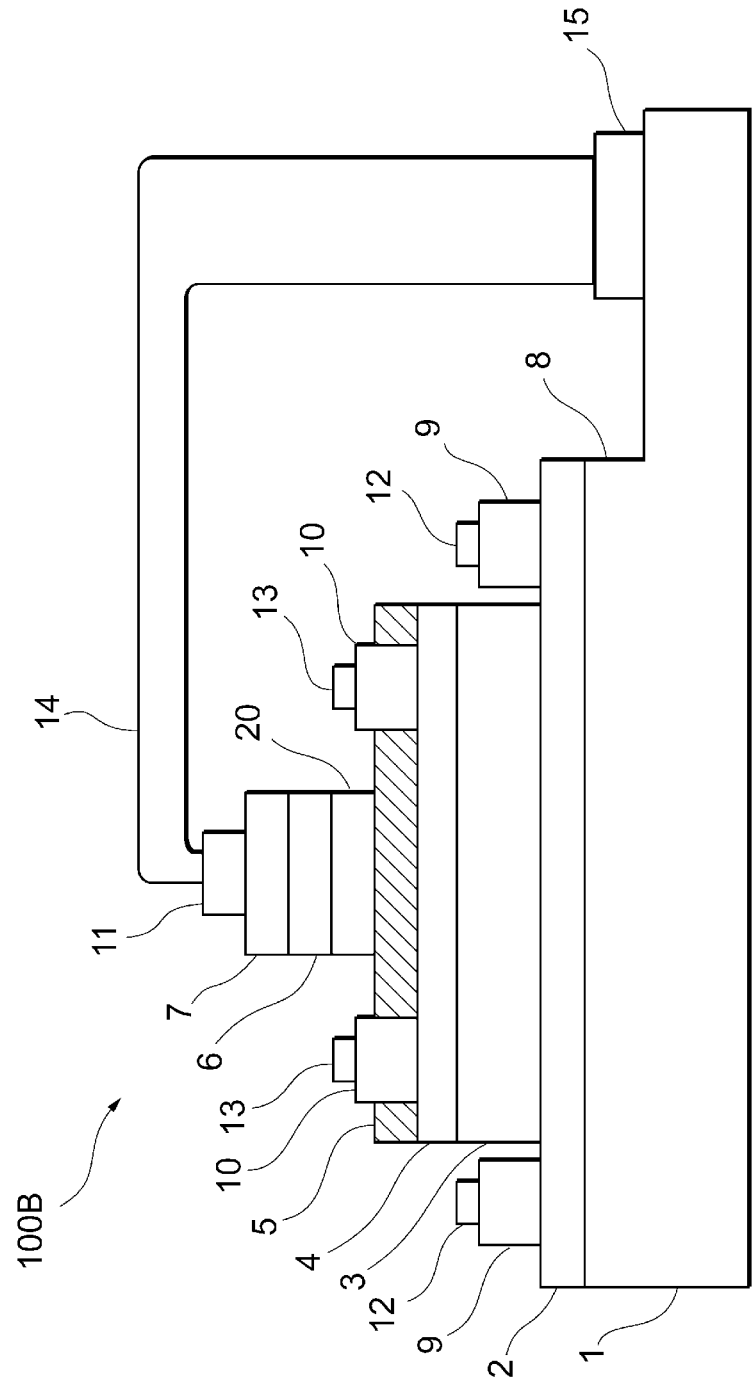
FIG. 7 is a sectional view of a HBT 100B according to another embodiment of the present disclosure.

FIG. 7 is a sectional view of a HBT 100B according to another embodiment of the present disclosure. A plan view of the HBT 100B is similar to FIG. 1 and is thus not shown. The same elements as those of the HBT 100A shown in FIG. 2 are designated by like reference numerals, and an explanation thereof will thus be omitted.

The configuration of the HBT 100B is the same as that of the HBT 100A, except that an n-type AlGaAs emitter ballast resistor layer 20 (an AlAs mole ratio of 0.33, a Si-doping concentration of $1\times10^{17}$ cm$^{-3}$, and a film thickness of 120 nm, for example) is disposed between the emitter layer 5 and the contact layer 6. The emitter ballast resistor layer 20 may not necessarily be a single layer, but may be a multilayer structure having two or more layers.

In the HBT 100B, GaAsPBi is used for the base layer 4. As in the HBT 100A, in the HBT 100B, it is possible to implement a high-performance HBT that is unlikely to decrease the process controllability and to increase the manufacturing cost. Additionally, in the HBT 100B, the provision of the emitter ballast resistor layer 20 makes it possible to suppress a sudden increase in the collector current caused by heat generation, that is, the occurrence of thermal runaway.

Figure 8:
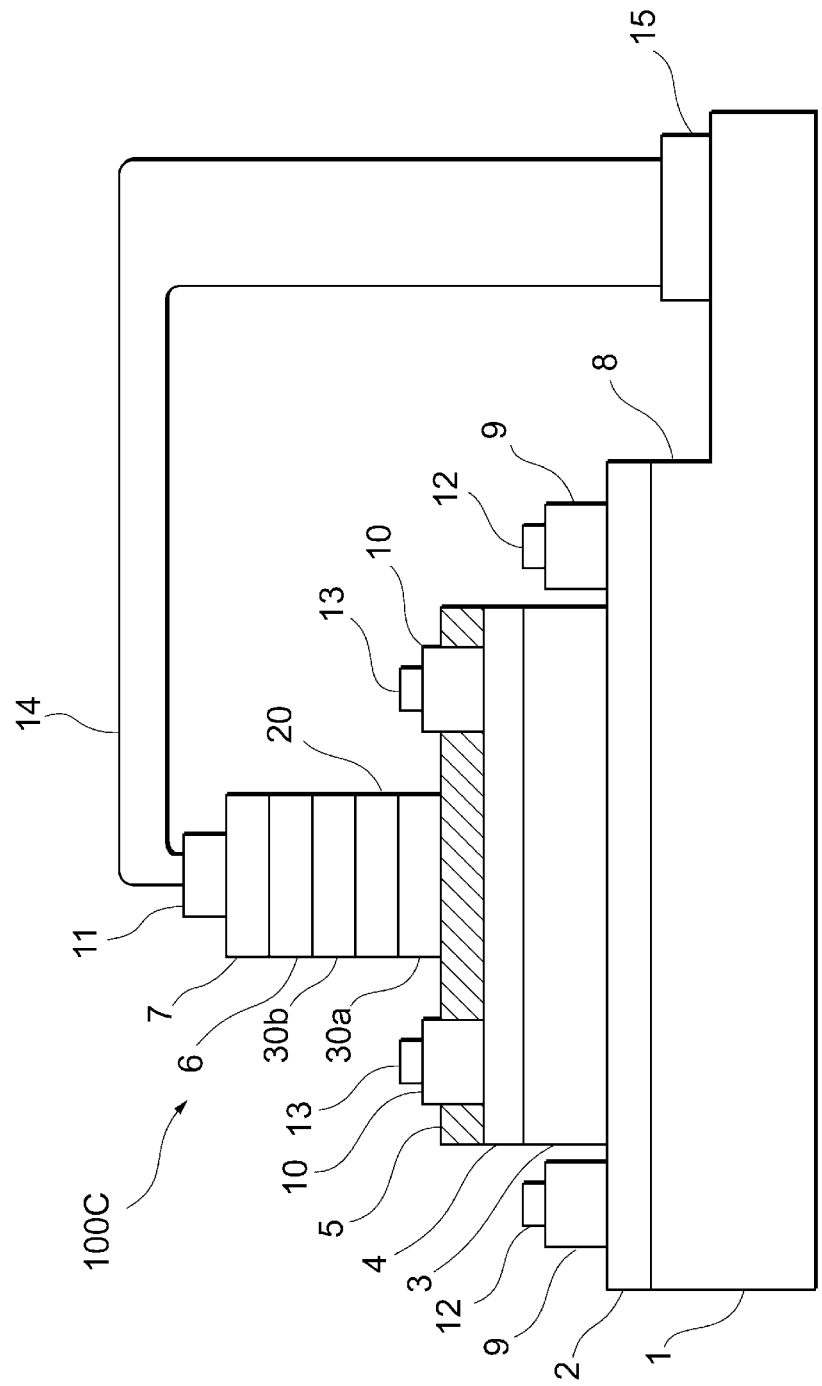
FIG. 8 is a sectional view of a HBT 100C according to another embodiment of the present disclosure.

FIG. 8 is a sectional view of a HBT 100C according to another embodiment of the present disclosure. A plan view of the HBT 100C is similar to FIG. 1 and is thus not shown. The same elements as those of the HBT 100B shown in FIG. 7 are designated by like reference numerals, and an explanation thereof will thus be omitted.

The configuration of the HBT 100C is the same as that of the HBT 100B, except that a graded composition layer 30a (n-type AlGaAs) (a Si-doping concentration of $1\times10^{17}$ cm$^{-3}$ and a film thickness of 90 nm, for example) is disposed between the emitter layer 5 and the emitter ballast resistor layer 20 and that a graded composition layer 30b (n-type AlGaAs) (a Si-doping concentration of $1\times10^{17}$ cm$^{-3}$ and a film thickness of 90 nm, for example) is disposed between the emitter ballast resistor layer 20 and the contact layer 6.

The graded composition layer 30a is provided for allowing the AlAs mole ratio to gradually change between the emitter layer 5 and the emitter ballast resistor layer 20. For example, the AlAs mole ratio in a portion of the graded composition layer 30a which contacts the emitter layer 5 is zero, while the AlAs mole ratio in a portion of the graded composition layer 30a which contacts the emitter ballast resistor layer 20 is 0.33. The AlAs mole ratio in the graded composition layer 30a between the emitter layer 5 and the emitter ballast resistor layer 20 changes linearly. Similarly, the graded composition layer 30b is provided for allowing the AlAs mole ratio to gradually change between the emitter ballast resistor layer 20 and the contact layer 6. For example, the AlAs mole ratio in a portion of the graded composition layer 30b which contacts the emitter ballast resistor layer 20 is 0.33, while the AlAs mole ratio in a portion of the graded composition layer 30b which contacts the contact layer 6 is zero. The AlAs mole ratio in the graded composition layer 30b between the emitter ballast resistor layer 20 and the contact layer 6 changes linearly.

In the HBT 100C, too, GaAsPBi is used for the base layer 4. As in the HBT 100A, it is thus possible to implement a high-performance HBT that is unlikely to decrease the process controllability and to increase the manufacturing cost. Additionally, in the HBT 100C, the provision of the emitter ballast resistor layer 20 and the graded composition layers 30a and 30b makes it possible to suppress a sudden increase in the collector current caused by heat generation, that is, the occurrence of thermal runaway.

FIG. 9 is a plan view of a HBT 100D according to another embodiment of the present disclosure. FIG. 10 is a sectional view of the HBT 100D taken along line 2-2 in FIG. 9. The same elements as those of the HBT 100A shown in FIG. 1 are designated by like reference numerals, and an explanation thereof will thus be omitted.

In the configuration of the HBT 100D, the HBT 100A is regarded as a unit HBT and plural units HBTs are connected in parallel with each other. Because of the parallel-connected plural HBTs, the HBT 100D is capable of handling high power, in addition to achieving advantages similar to those obtained by the HBT 100A. Similarly, concerning the HBTs 100B and 100C, by connecting plural HBTs 100B and plural HBTs 100C in parallel with each other, the HBTs 100B and the HBTs 100C are also capable of handling high power.

An example of a manufacturing process for the HBT 100D will be described below with reference to FIGS. 11A through 11I.

Figure 11A:
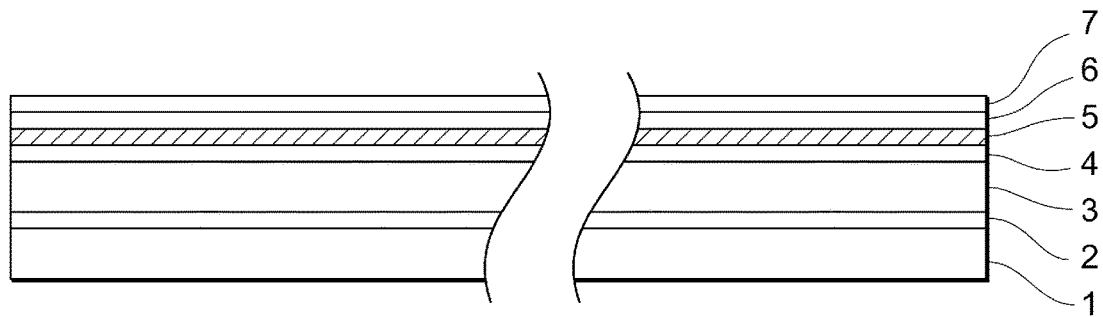
FIG. 11A is a view illustrating part of a manufacturing process for the HBT 100D.

As shown in FIG. 11A, on a semi-insulating GaAs substrate 1, a sub-collector layer 2 (n-type GaAs) (a Si-doping concentration of $5\times10^{18}$ cm$^{-3}$ and a film thickness of 0.6 µm, for example), a collector layer 3 (n-type GaAs) (a Si-doping concentration of $1\times10^{16}$ cm$^{-3}$ and a film thickness of 1.0 µm, for example), a p-type GaAs$_{0.7}$P$_{0.23}$Bi$_{0.07}$ base layer 4 (a C-doping concentration of $2\times10^{19}$ cm$^{-3}$ and a film thickness of 150 nm, for example), an emitter layer 5 (n-type InGaP) (an InP mole ratio of 0.48, a Si-doping concentration of $3\times10^{17}$ cm$^{-3}$, and a film thickness of 30 nm, for example), a contact layer 6 (n-type GaAs) (a Si-doping concentration of $5\times10^{18}$ cm$^{-3}$ and a film thickness of 50 nm, for example), and a contact layer 7 (n-type InGaAs) (an InAs mole ratio of 0.5, a Si-doping concentration of $1\times10^{19}$ cm$^{-3}$, and a film thickness of 50 nm, for example) are stacked on each other by metalorganic vapor phase epitaxy, for example.

Figure 11B:
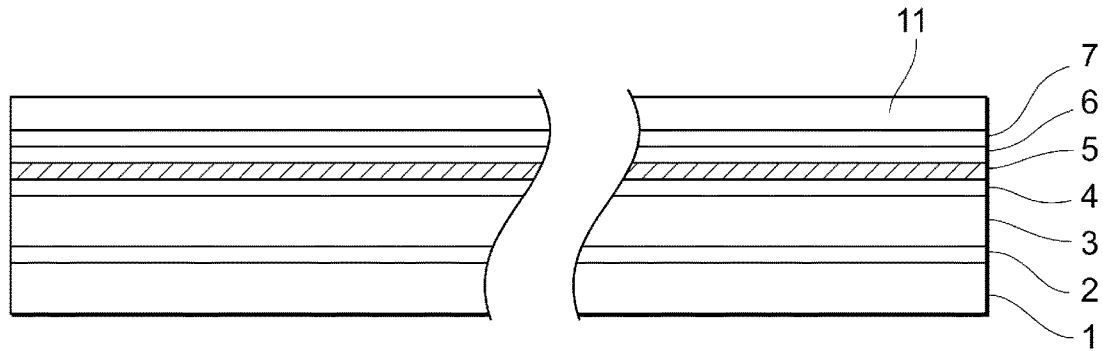
FIG. 11B is a view illustrating part of the manufacturing process for the HBT 100D.

Then, as shown in FIG. 11B, WSi 11 (a Si mole ratio of 0.3 and a film thickness of 0.3 μm, for example) is deposited on the entire surface of the wafer by using radio-frequency sputtering.

Figure 11C:
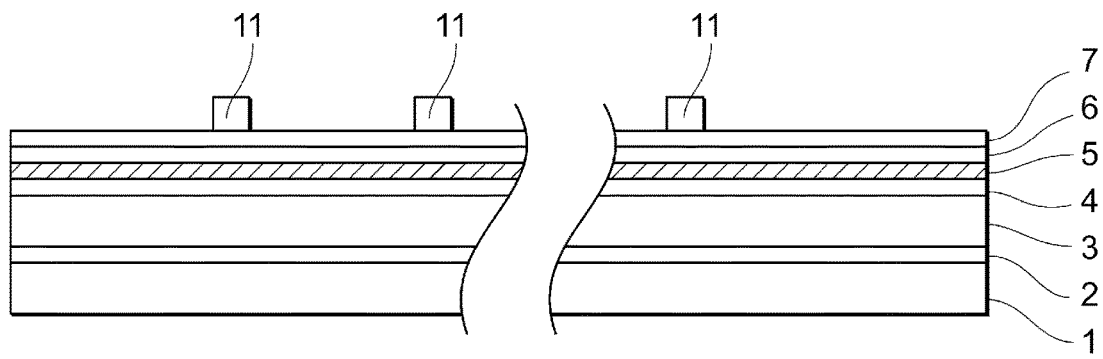
FIG. 11C is a view illustrating part of the manufacturing process for the HBT 100D.

Then, as shown in FIG. 11C, emitter electrodes 11 (WSi layer) are processed by photolithography and dry etching using CF$_4$, thereby forming the emitter electrodes 11.

Figure 11D:
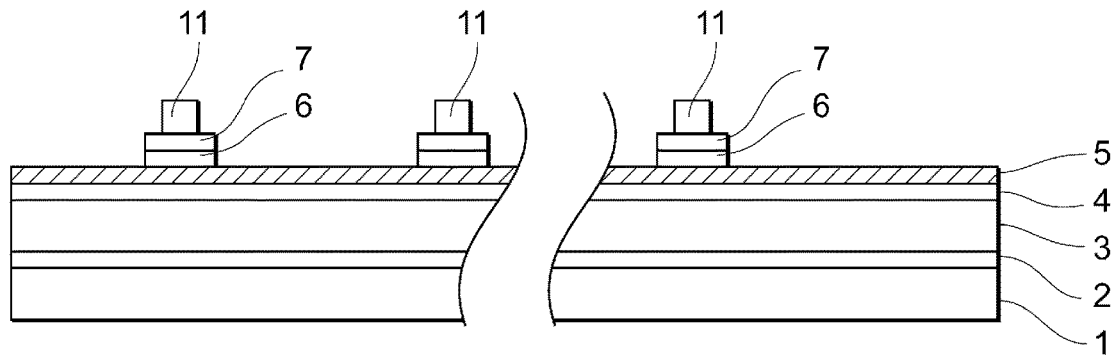
FIG. 11D is a view illustrating part of the manufacturing process for the HBT 100D.

Then, as shown in FIG. 11D, the contact layers 7 and 6 are processed into a desired shape so as to form an emitter region. For example, the emitter region may be formed by removing unnecessary portions of the contact layers 7 and 6 by photolithography and selective wet etching using an etchant. The composition of the etchant may be phosphoric acid: hydrogen peroxide solution: water=1:2:40, for example. When the emitter layer 5 is exposed in accordance with the progress of etching, etching automatically stops.

Figure 11E:
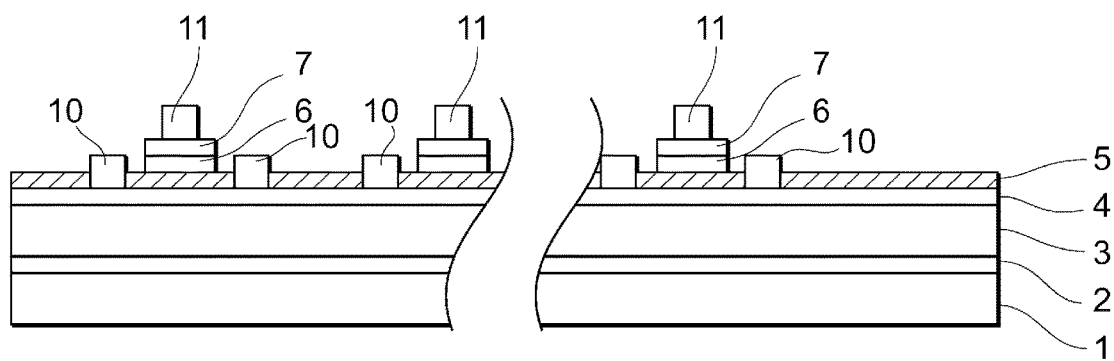
FIG. 11E is a view illustrating part of the manufacturing process for the HBT 100D.

Then, as shown in FIG. 11E, by vapor deposition and a liftoff process, base electrodes 10 made of Ti (a film thickness of 50 nm, for example)/Pt (a film thickness of 50 nm, for example)/Au (a film thickness of 200 nm, for example) are formed on the base layer 4 while passing through the emitter layer 5.

Figure 11F:
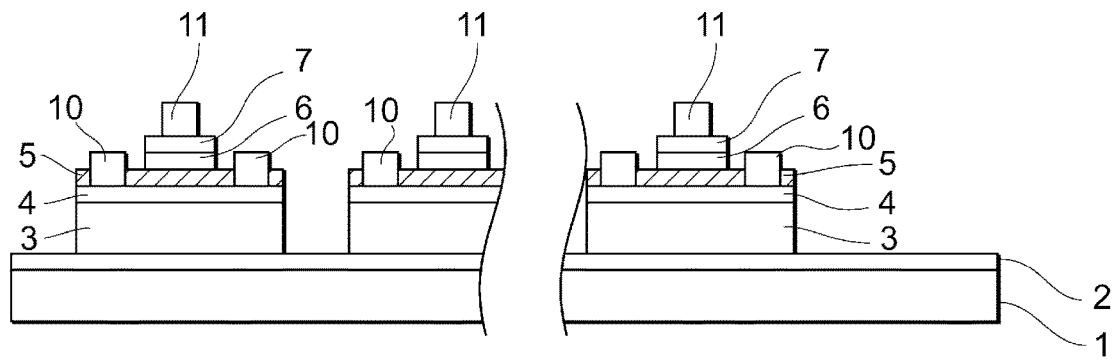
FIG. 11F is a view illustrating part of the manufacturing process for the HBT 100D.

Then, as shown in FIG. 11F, by removing unnecessary portions of the emitter layer 5, the base layer 4, and the collector layer 3 by photolithography and wet etching, the sub-collector layer 2 is exposed so as to form a base region. As an etchant for etching the emitter layer 5, hydrochloric acid may be used, for example. The etching of the emitter layer 5 is selective wet etching, and when the base layer 4 is exposed in accordance with the progress of etching, etching automatically stops. The composition of an etchant used for etching the base layer 4 and the collector layer 3 may be phosphoric acid: hydrogen peroxide solution: water=1:2:40, for example.

Figure 11G:
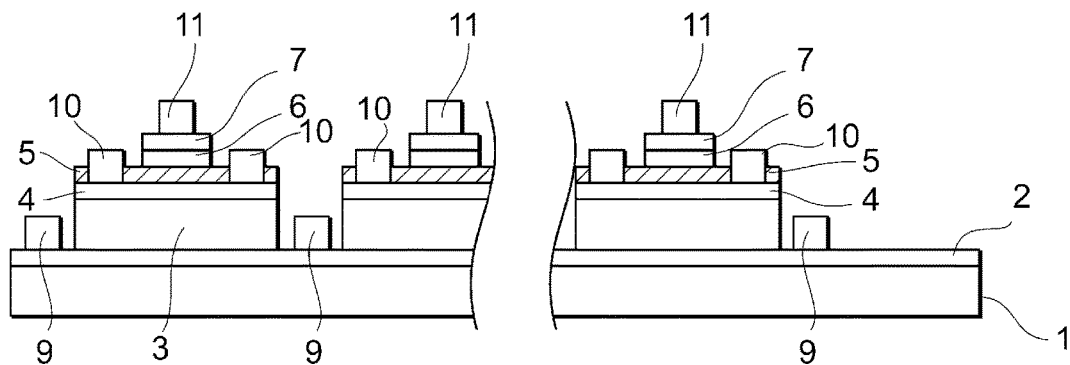
FIG. 11G is a view illustrating part of the manufacturing process for the HBT 100D.

Then, as shown in FIG. 11G, collector electrodes 9 are formed by vapor deposition and a liftoff process by processing metals for 30 minutes at 350° C., for example, to form an alloy. The collector electrodes 9 are a multilayer body of AuGe (a film thickness of 60 nm, for example)/Ni (a film thickness of 10 nm, for example)/Au (a film thickness of 200 nm, for example), for example.

Figure 11H:
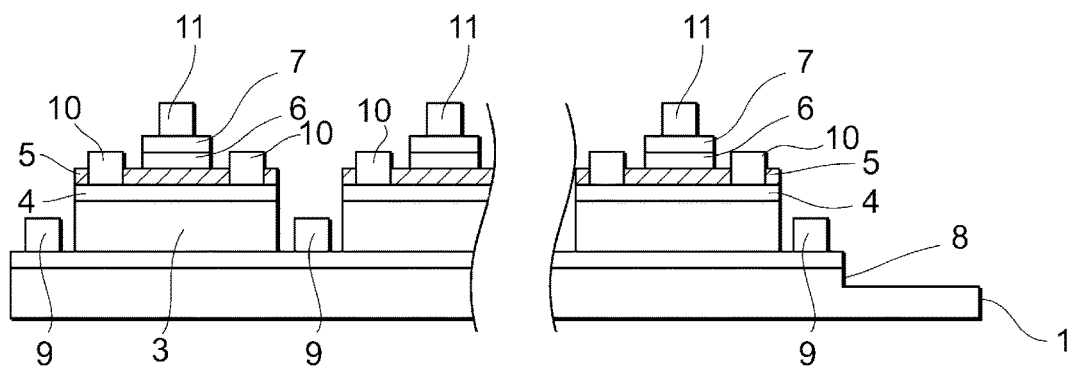
FIG. 11H is a view illustrating part of the manufacturing process for the HBT 100D.

Then, as shown in FIG. 11H, isolation grooves 8 are formed by wet etching. The composition of an etchant may be phosphoric acid: hydrogen peroxide solution: water=1: 2:40, for example.

Figure 11I:
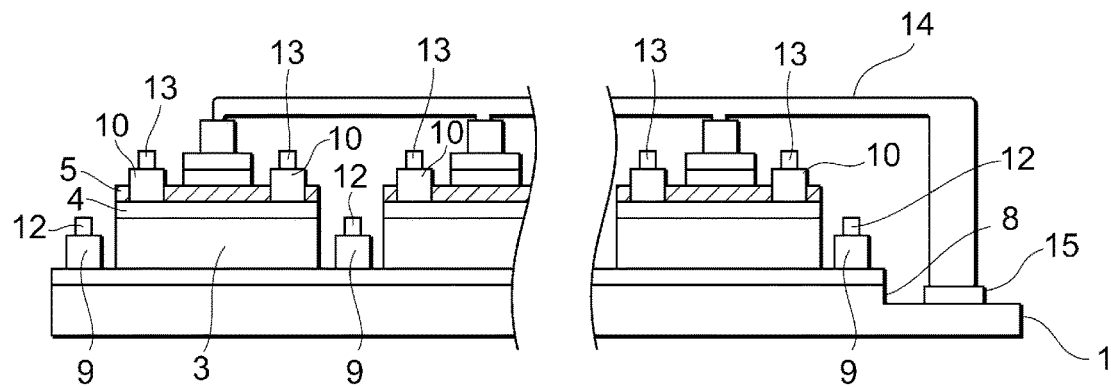
FIG. 11I is a view illustrating part of the manufacturing process for the HBT 100D.

Finally, as shown in FIG. 11I, wiring patterns for connecting the emitter electrodes 11, the base electrodes 10, and the collector electrodes 9 between the unit HBTs are formed.

By using the technology shown in FIGS. 11A through 11I, the HBT 100D can be manufactured. Concerning the HBT 100A, the HBT 100B, and plural HBTs 100B connected in parallel with each other, the HBT 100C, and plural HBTs 100C connected in parallel with each other, too, by using the technology shown in FIGS. 11A through 11I and also by using an additional typical technology if necessary, it is possible to manufacture a HBT by a process that is unlikely to decrease the process controllability and to increase the manufacturing cost.

Figure 12:
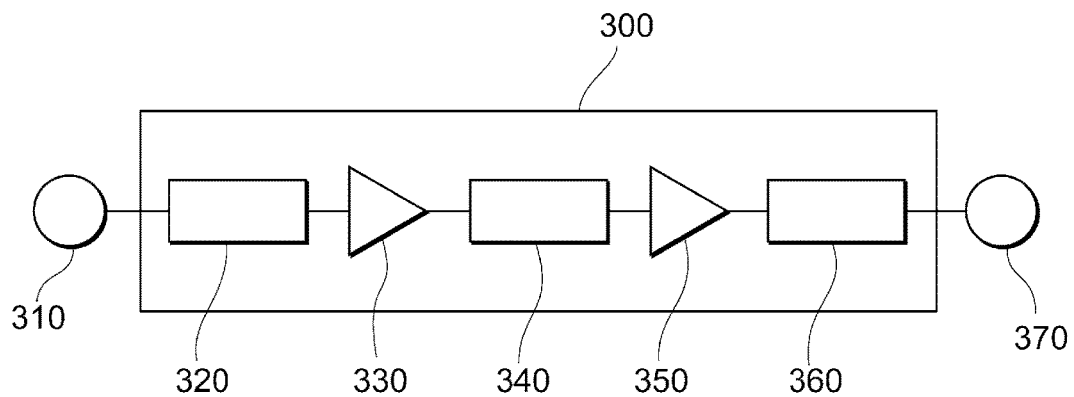
FIG. 12 is a view illustrating an example of the configuration of a power amplifier module 300 using one of the HBTs 100A through 100D as a power amplifier element.

FIG. 12 illustrates an example of the configuration of a power amplifier module 300 using one of the HBTs 100A through 100D as a power amplifier element.

As shown in FIG. 12, the power amplifier module 300 includes an input terminal 310, matching circuits 320, 340, and 360, amplifier circuits 330 and 350, and an output terminal 370. A RF (Radio Frequency) input signal is input into the input terminal 310. The matching circuit 320 performs impedance matching on the signal output from the input terminal 310. The amplifier circuit 330 amplifies the signal output from the matching circuit 320. The matching circuit 340 performs impedance matching on the signal output from the amplifier circuit 330. The amplifier circuit 350 amplifies the signal output from the matching circuit 340. The matching circuit 360 performs impedance matching on the signal output from the amplifier circuit 350. The output terminal 370 outputs the signal output from the matching circuit 360 as a RF output signal.

In the power amplifier module 300, one of the HBTs 100A through 100D can be used as power amplifier elements in the amplifier circuits 330 and 350. In FIG. 12, the power amplifier module having two stages of amplifier circuits is shown. However, the number of stages of amplifier circuits is not restricted to two, and one stage of amplifier circuit or three or more stages of amplifier circuits may be used.

Figure 13:
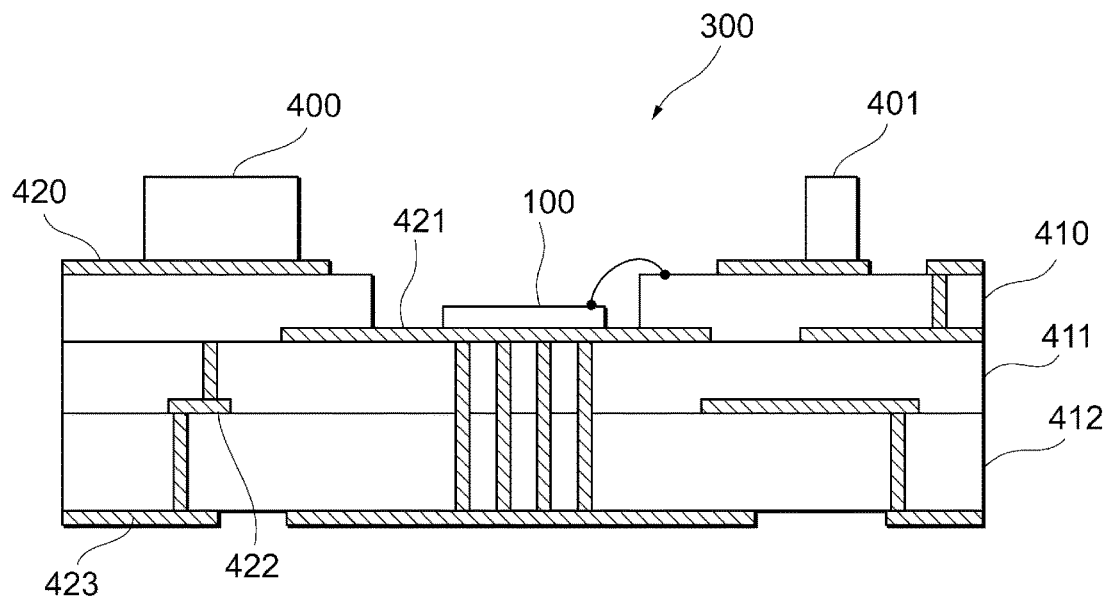
FIG. 13 is a sectional view illustrating an example of the state of the power amplifier module 300 in which a HBT 100 (one of the HBTs 100A through 100D) is mounted.

FIG. 13 is a sectional view illustrating an example of the state of the power amplifier module 300 in which a HBT 100 (one of the HBTs 100A through 100D) is mounted. In the power amplifier module 300, mounting substrates 410 through 412 are stacked on each other, as shown in FIG. 13. On the mounting substrate 411, the HBT 100 is formed. On the mounting substrate 410, passive elements 400 and 401, such as a capacitor and an inductor, used in the matching circuits 320, 340, and 360 are formed. On the mounting substrates 410 through 412, conductive layers 420 through 423 for electrically connecting the HBT 100 and the passive elements 400 and 401 are formed.

In this manner, the power amplifier module 300 can be formed by using the high-performance HBT 100 that is unlikely to decrease the process controllability and to increase the manufacturing cost.

Several embodiments of the present disclosure have been discussed above. In the HBTs 100A through 100D, the emitter layer is formed of InGaP, and the base layer is formed of GaAsPBi that substantially lattice-matches GaAs.

This configuration allows the energy discontinuity $\Delta E_{C\_eb}$ in the conduction band edge between the emitter layer 5 and the base layer 4 to be almost zero, as shown in FIG. 6. It is thus possible to reduce the offset voltage in the HBTs 100A through 100D to be lower than in a typical HBT. In the HBTs 100A through 100D, the energy discontinuity $\Delta E_{V\_eb}$ in the valence band edge between the emitter layer 5 and the base layer 4 can be increased. It is thus possible to reduce the base resistance in the HBTs 100A through 100D to be lower than in a typical HBT.

In the HBTs 100A through 100D, an InGaP single layer which allows selective wet etching to be employed is used as the emitter layer 5. It is thus less likely that the process controllability will be decreased and the complexity of the epitaxial multilayer film structure will be increased in the HBTs 100A through 100D than in a typical HBT. By using the HBTs 100A through 100D, it is possible to implement a high-performance HBT that is unlikely to decrease the process controllability and to increase the manufacturing cost.

The above-described embodiments are provided for facilitating the understanding of the disclosure, but are not intended to be exhaustive or to limit the disclosure to the precise forms disclosed. Modifications and/or improvements may be made without departing from the scope and spirit of the disclosure, and equivalents of the disclosure are also encompassed in the disclosure. That is, suitable design changes made to the embodiments by those skilled in the art are also encompassed in the disclosure within the scope and spirit of the disclosure. For example, the elements of the embodiments and the positions, materials, conditions, configurations, and sizes thereof are not restricted to those described in the embodiments and may be changed in an appropriate manner. The elements of the embodiments may be combined within a technically possible range, and configurations obtained by combining the elements of the embodiments are also encompassed in the disclosure within the scope and spirit of the disclosure.

The invention claimed is:

1. A heterojunction bipolar transistor, comprising on a GaAs substrate:
    an emitter layer;
    a base layer; and
    a collector layer, wherein
    the emitter layer is formed of InGaP,
    the base layer is formed of GaAsPBi having a composition that substantially lattice-matches GaAs, and
    the composition of $GaAs_{(1-Y-Z)}P_{(Y)}Bi_{(Z)}$ forming the base layer satisfies a condition expressed by $0<Z\leq0.07$.

2. The heterojunction bipolar transistor according to claim 1, wherein a difference between a lattice constant of GaAsPBi forming the base layer and a lattice constant of GaAs is within 0.12%.

3. The heterojunction bipolar transistor according to claim 2, further comprising:
    an emitter ballast resistor layer.

4. The heterojunction bipolar transistor according to claim 1, further comprising:
    an emitter ballast resistor layer.

5. The heterojunction bipolar transistor according to claim 4, wherein the emitter ballast resistor layer is formed of AlGaAs.

6. A heterojunction bipolar transistor according to claim 4, wherein the emitter ballast resistor layer comprises a graded composition layer.

7. A heterojunction bipolar transistor device comprising:
    plural heterojunction bipolar transistors according to claim 1 connected in parallel with each other.

8. A heterojunction bipolar transistor device comprising:
    plural heterojunction bipolar transistors according to claim 2 connected in parallel with each other.

9. A heterojunction bipolar transistor device comprising:
    plural heterojunction bipolar transistors according to claim 4 connected in parallel with each other.

10. A power amplifier module comprising:
    the heterojunction bipolar transistor according to claim 1 as a power amplifier element.

11. A power amplifier module comprising:
    the heterojunction bipolar transistor according to claim 2 as a power amplifier element.

12. A power amplifier module comprising:
    the heterojunction bipolar transistor according to claim 4 as a power amplifier element.

* * * * *